US009251892B1

(12) United States Patent
Asami et al.

(10) Patent No.: US 9,251,892 B1
(45) Date of Patent: Feb. 2, 2016

(54) MEMORY SYSTEM AND METHOD OF CONTROLLING NONVOLATILE MEMORY

(71) Applicant: Kabushiki Kaisha Toshiba, Minato-ku (JP)

(72) Inventors: Shohei Asami, Yokohama (JP); Toshikatsu Hida, Yokohama (JP); Tokumasa Hara, Kawasaki (JP); Riki Suzuki, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/636,685

(22) Filed: Mar. 3, 2015

Related U.S. Application Data

(60) Provisional application No. 62/049,021, filed on Sep. 11, 2014.

(51) Int. Cl.
*G11C 11/34* (2006.01)
*G11C 16/04* (2006.01)
*G11C 11/56* (2006.01)

(52) U.S. Cl.
CPC .................................. *G11C 11/5642* (2013.01)

(58) Field of Classification Search
CPC .......... G11C 16/3404; G11C 16/0483; G11C 16/3427; G11C 11/5628; G11C 11/5642; G11C 16/04; G11C 16/3454; G11C 2211/5646; G11C 16/10; G11C 16/16; G11C 8/08
See application file for complete search history.

(56) References Cited

U.S. PATENT DOCUMENTS

| 2006/0126394 | A1* | 6/2006 | Li | G11C 11/5628 |
| | | | | 365/185.22 |
| 2008/0158951 | A1* | 7/2008 | Aritome | G11C 11/5628 |
| | | | | 365/185.03 |
| 2009/0268516 | A1 | 10/2009 | Murin et al. | |
| 2012/0195120 | A1* | 8/2012 | Iwai | G11C 11/5628 |
| | | | | 365/185.03 |
| 2012/0201077 | A1* | 8/2012 | Nagao | G11C 11/5628 |
| | | | | 365/185.03 |
| 2013/0058166 | A1* | 3/2013 | Maejima | G11C 16/10 |
| | | | | 365/185.18 |
| 2014/0293693 | A1* | 10/2014 | Nam | G11C 16/10 |
| | | | | 356/185.11 |

FOREIGN PATENT DOCUMENTS

| JP | 2001 28194 | 1/2001 |
| JP | 2007 188593 | 7/2007 |

* cited by examiner

*Primary Examiner* — Hien Nguyen
(74) *Attorney, Agent, or Firm* — Oblon, McClelland, Maier & Neustadt, L.L.P.

(57) ABSTRACT

According to an embodiment, a controller specifies a first voltage range that has a first distribution quantity, a second voltage range that is adjacent to a lower voltage side of the first voltage range, and a third voltage range that is adjacent to a higher voltage side of the first voltage range. The first distribution quantity is a minimum value of the memory cells. The controller determines a read voltage by using the first voltage range, a first representative voltage value in the first voltage range, the first distribution quantity, a second distribution quantity corresponding to the second voltage range, and a third distribution quantity corresponding to the third voltage range.

20 Claims, 8 Drawing Sheets

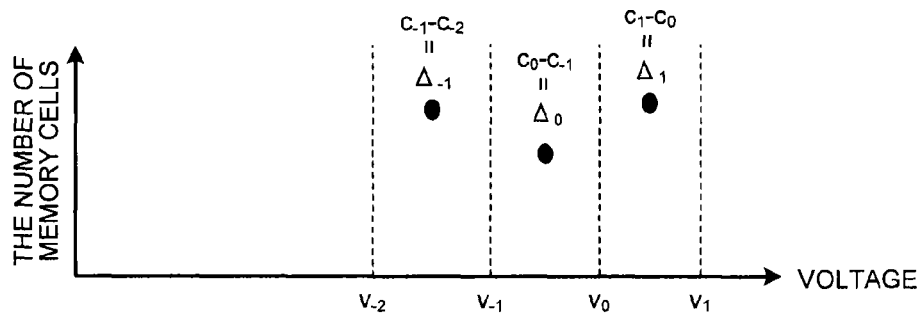
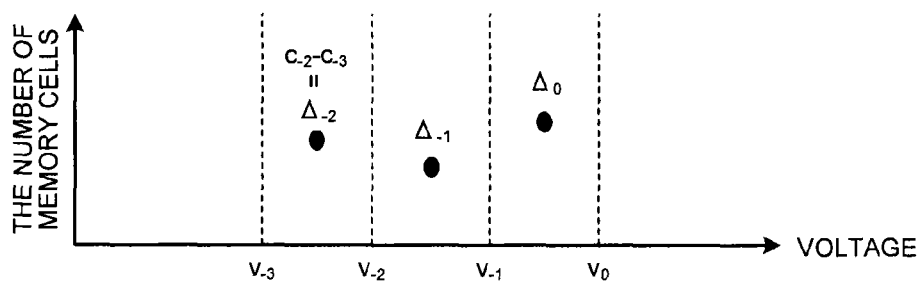
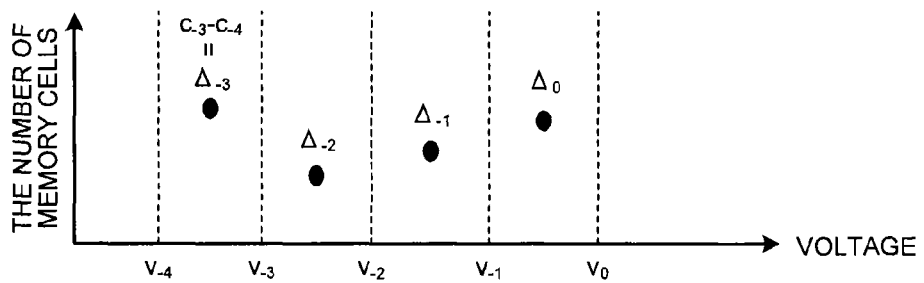
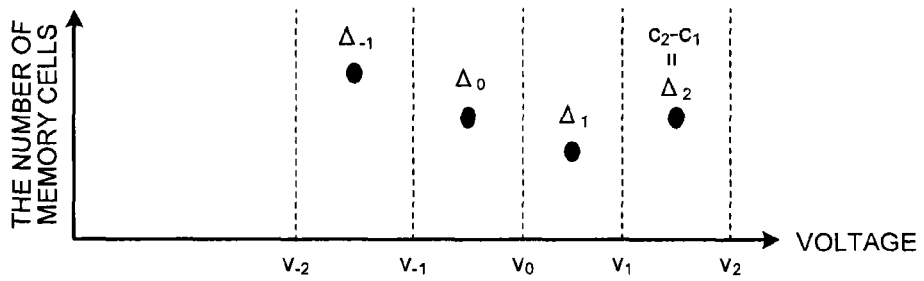

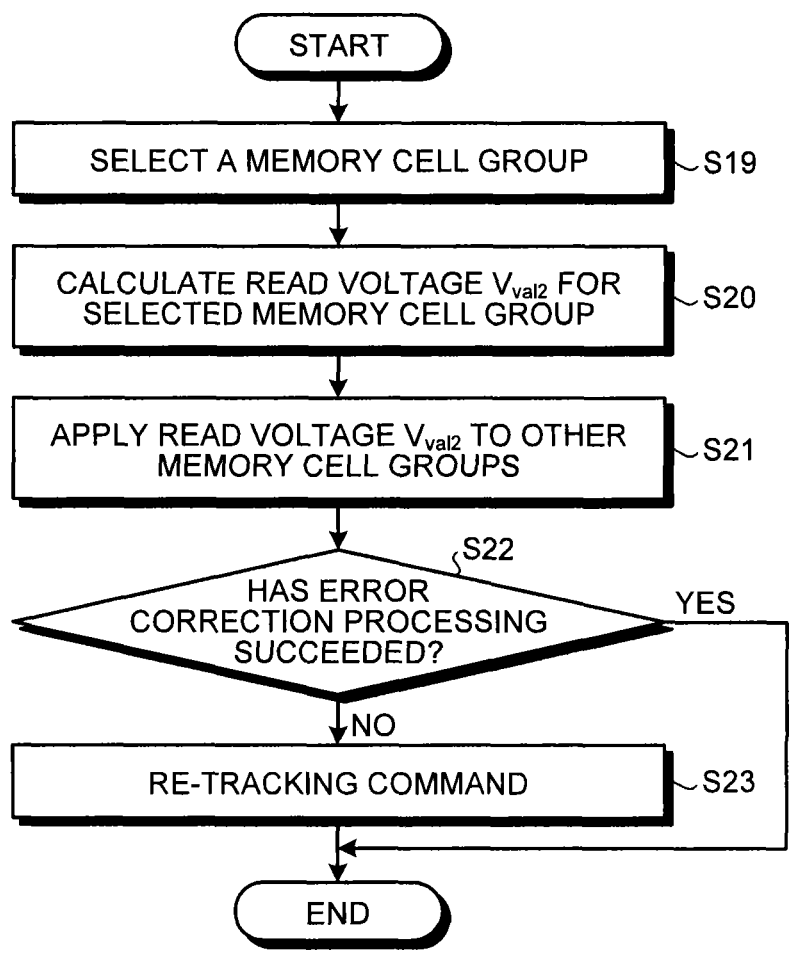

MEMORY SYSTEM AND METHOD OF CONTROLLING NONVOLATILE MEMORY

CROSS-REFERENCE TO RELATED APPLICATIONS

This application is based upon and claims the benefit of priority from U.S. Provisional Application No. 62/049,021, filed on Sep. 11, 2014; the entire contents of which are incorporated herein by reference.

FIELD

Embodiments described herein relate generally to a memory system and a method of controlling a nonvolatile memory.

BACKGROUND

A nonvolatile memory, represented by a NAND type flash memory, is applied with an appropriate read voltage, whereby information stored therein is read. This appropriate read voltage may vary from that in a default state.

BRIEF DESCRIPTION OF THE DRAWINGS

FIGS. 6A to 6D are views each illustrating a resultant pattern of statistical processing in the aggregating unit;

FIG. 9 is a flowchart of a method of determining a data read voltage in a memory system according to a third embodiment.

DETAILED DESCRIPTION

According to an embodiment, a memory system includes a nonvolatile memory and a controller. The nonvolatile memory includes a plurality of memory cells. Each of the memory cells has a storage capacity of N bits in accordance with 2 to the power of N threshold voltage distributions, where N is a natural number that is equal to or greater than 1. The controller reads data from the plurality of memory cells by using four voltage values. The controller associates three voltage ranges designated by the four voltage values with a number of the memory cells using the four voltage values. The controller specifies, from the three voltage ranges, a first voltage range, a second voltage range, and a third voltage range, the first voltage range having a first distributed number of memory cells, the first distributed number of memory cells being a minimum value of the memory cells, the second voltage range being adjacent to a lower voltage side of the first voltage range, the third voltage range being adjacent to a higher voltage side of the first voltage range. The controller determines a read voltage by using the first voltage range, a first representative voltage value in the first voltage range, the first distributed number of memory cells, a second distributed number of memory cells, and a third distributed number of memory cells, the second distributed number of memory cells being a number of memory cells corresponding to the second voltage range, the third distributed number of memory cells being a number of memory cells corresponding to the third voltage range. The controller reads the data from the nonvolatile memory by using the determined read voltage.

Details of a memory system and a method of controlling a nonvolatile memory according to some embodiments will be described below with reference to the accompanying drawings. It should be noted that these embodiments are not intended to limit the present invention.

First Embodiment

Figure 1:
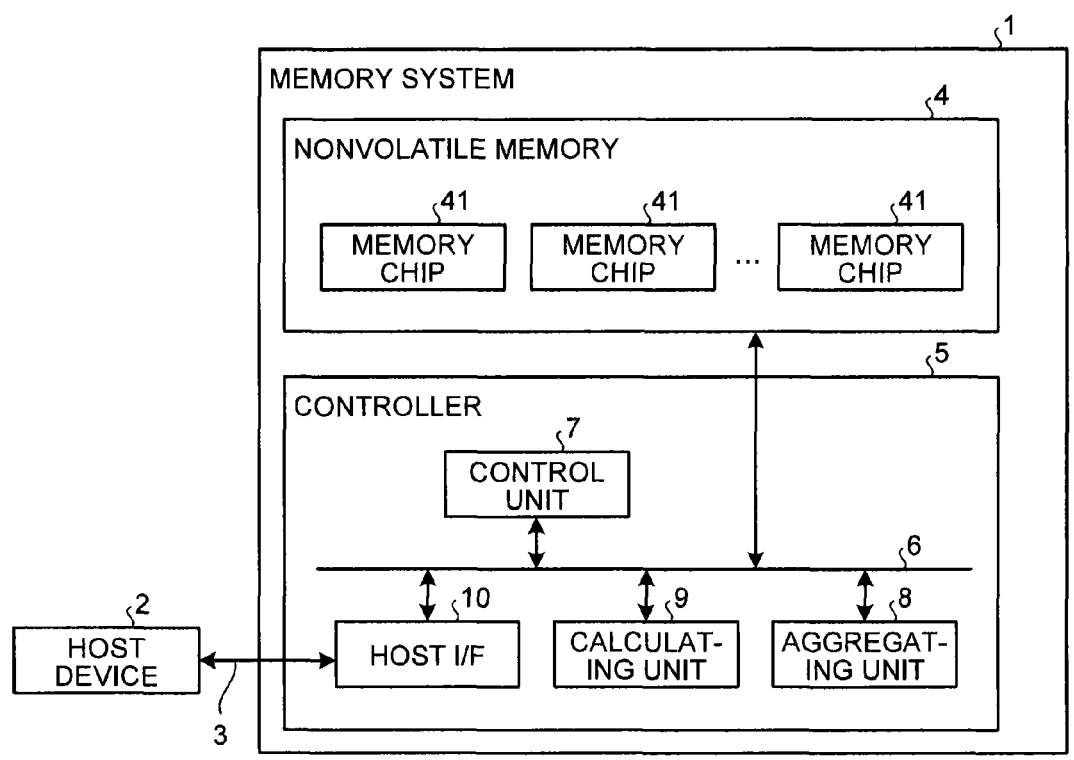
FIG. 1 is a block diagram illustrating a configuration of a memory system according to a first embodiment.

FIG. 1 is a block diagram illustrating a configuration of a memory system 1 according to a first embodiment. As illustrated in FIG. 1, the memory system 1 is connected to a host device 2 via a communication path 3, and configures an information processing device, for example, in a personal computer, a portable phone, an imaging device, and the like. The memory system 1 functions as an external storage device for the host device 2.

The host device 2 sends a write command to the memory system 1 when writing generated data to the memory system 1. Furthermore, the host device 2 sends a read command to the memory system 1 when reading data from the memory system 1.

The memory system 1 includes a nonvolatile memory 4 and a controller 5. An example of the nonvolatile memory 4 is a NAND flash memory. The nonvolatile memory 4 has one or more memory chips 41. A description will be, herein, given regarding an exemplary case in which a NAND flash memory is used as the nonvolatile memory 4; however it may be not only a NAND flash memory but also any other memory such as an MRAM (Magnetoresistive Random Access Memory) or a ReRAM (Resistance Random Access Memory).

Figure 2:
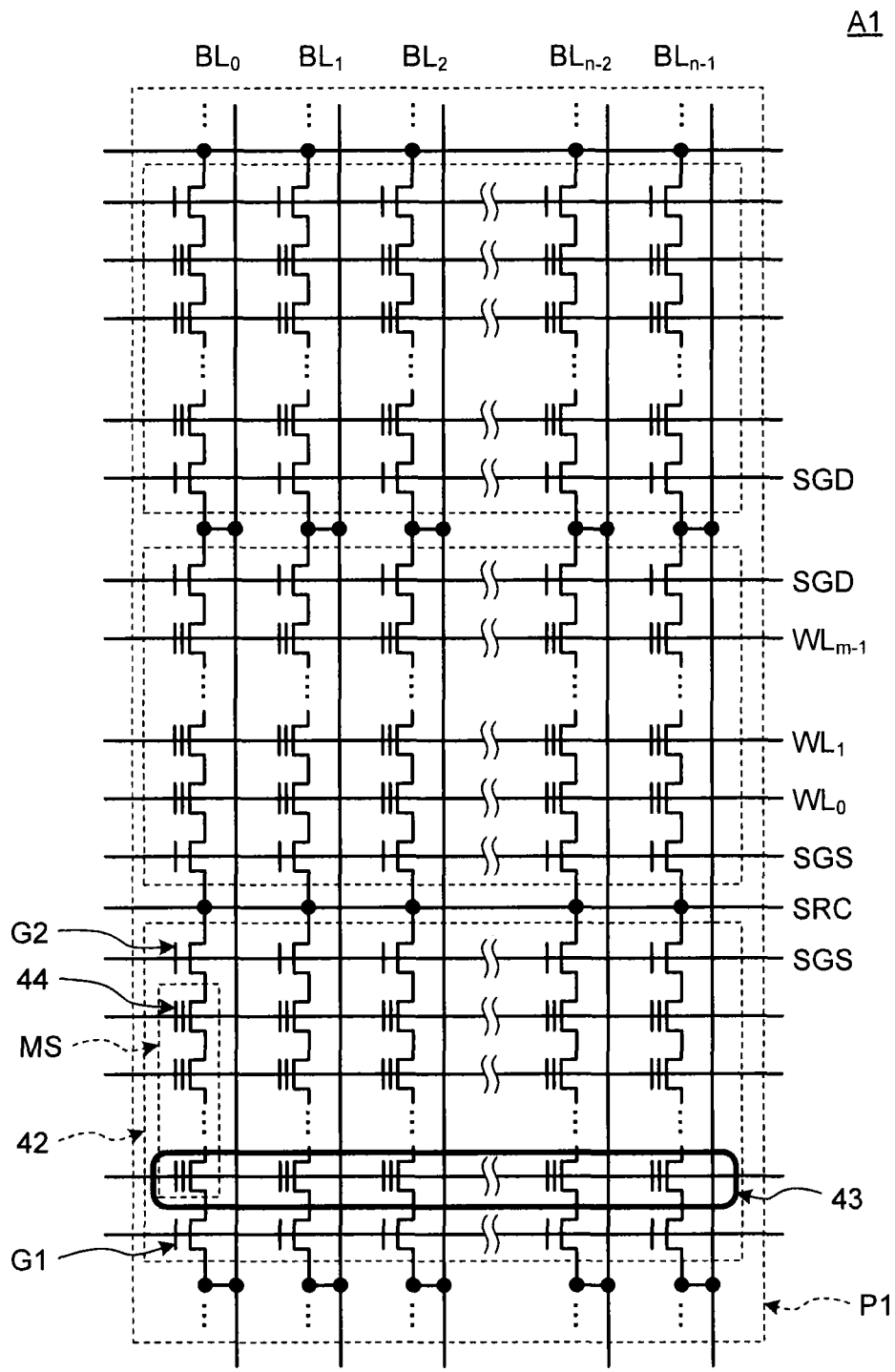
FIG. 2 is a view illustrating a configuration of the memory cell array.

Each memory chip 41 has a memory cell array A1 as illustrated in FIG. 2. The memory cell array A1, which is a NAND cell type memory cell array, is formed of a plurality of memory cells 44 arranged in a matrix pattern, and includes a plurality of NAND cells. Each NAND cell includes a memory string MS formed of memory cells 44 connected in series, and selective gates G1 and G2 connected to the respective ends of the memory string MS. The selective gates G1 are connected to bit lines $BL_0$ to $BL_{n-1}$, and the selective gates G2 are connected to a source line SRC. The control gates of memory cells 44 arranged in the same row are connected commonly to a corresponding one of word lines $WL_0$ to $WL_{m-1}$. The first selective gates G1 are connected commonly to a selection line SGD, and second selective gates G2 are connected commonly to a selection line SGS.

The memory cell array A1 includes one or more planes P1, each of the planes contains a plurality of blocks 42. Each block 42 includes a plurality of NAND cells, and serves as a unit for data erasing.

A plurality of memory cells 44 connected to one of the word lines constitutes a memory cell group 43 as a physical sector. When each memory cell 44 stores a single bit (binary), one of the memory cell groups 43 corresponds to a single page. When each memory cell 44 stores two or more bits (multiple values), one of the memory cell groups 43 corresponds to multiple pages. Data are written to or read from a NAND flash memory for each page. During a read operation, a program verification operation and a program operation, a single word line and a single page are selected in accordance with a physical address received from a control unit 7. The pages are switched on the basis of the physical address.

The controller 5 controls write and read commands from the host device 2, and includes an internal bus 6, the control unit 7, an aggregating unit 8, a calculating unit 9, and a host interface (hereinafter referred to as a "host I/F") 10. The internal bus 6 interconnects the nonvolatile memory 4, the control unit 7, the aggregating unit 8, the calculating unit 9, and the host I/F 10.

When the control unit 7 receives a write command from the host device 2 via the host I/F 10 and the internal bus 6, the control unit 7 writes data to the nonvolatile memory 4 in accordance with the write command. When the control unit 7 receives a read command from the host device 2, the control unit 7 reads data from the nonvolatile memory 4 in accordance with the read command, and then sends the read data to the host device 2. During such data reading, the control unit 7 applies read voltages to the memory cells 44 in the nonvolatile memory 4, and then identifies the data stored in these memory cells 44. Hereinafter, a read voltage applied to the memory cells 44 in order to read data that will be sent from the memory system 1 to the host device 2 is referred to as a data read voltage. The control unit 7 has an ECC (Error Checking and Correction) circuit (not illustrated). The ECC circuit detects errors in the data read from the nonvolatile memory 4 and corrects them (hereinafter referred to as "error correction processing") by using an error correction code such as an LDPC (Low Density Parity Check) or BCH (Bose Chaudhuri Hocqenghem) code. When the control unit 7 determines that the ECC circuit has failed to perform the error correction processing as a result of, for example, an event where the number of errors in the read data exceeds the capacity of the ECC circuit to perform the error correction processing, the controller sends a tracking command to the aggregating unit 8.

When the aggregating unit 8 receives the tracking command from the control unit 7, the aggregating unit 8 performs a statistical processing for the distribution states of the memory cells 44 in the nonvolatile memory 4, as will be described later, and then sends the processing result to the calculating unit 9.

The calculating unit 9 calculates a read voltage for memory cells 44 by using the result of the statistical processing which has been received from the aggregating unit 8, as will be described later, and then sends this evaluation result to the control unit 7.

The host I/F 10 outputs commands, write data, and the like which have been received from the host device 2 to the internal bus 6. Moreover, the host I/F 10 sends read data and the like from the nonvolatile memory 4 to the host device 2.

Figure 3A:
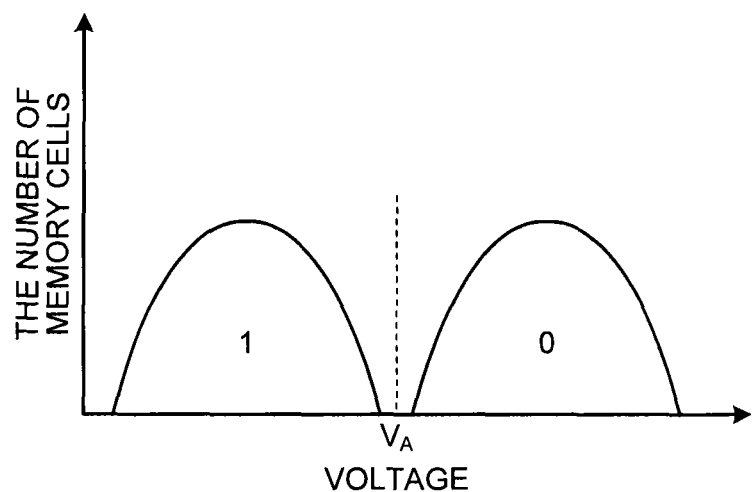
FIGS. 3A and 3B are views each illustrating an exemplary distribution and variation in threshold voltages.
Figure 3B:
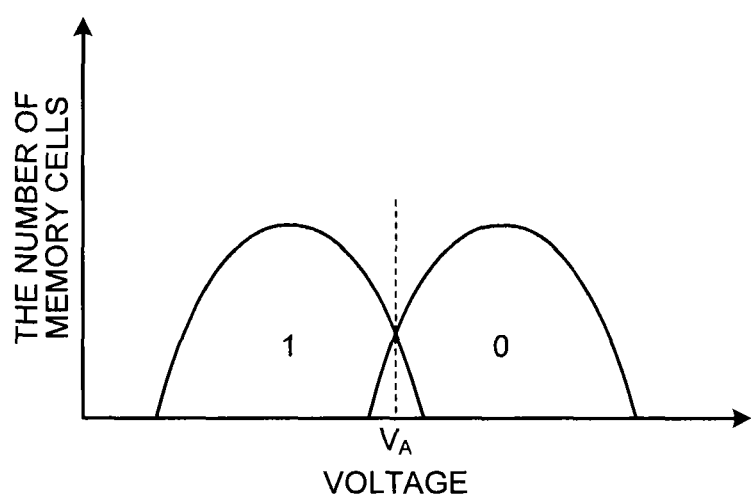

FIGS. 3A and 3B are views each illustrating an exemplary distribution and variation in threshold voltages. Assuming that the nonvolatile memory 4 is a NAND flash memory, when a voltage that is equal to or more than a voltage value according to a charge amount of a floating gate is applied to each memory cell 44, current flows therethrough; whereas when a voltage less than the voltage value is applied, no current flows. This boundary voltage is referred to as a threshold voltage. In each memory cell 44, stored data are related to a plurality of threshold voltages distributions (threshold distributions). Upon reading data, each memory cell 44 is applied with the data read voltage, and the data are determined depending on whether the data read voltage is higher or lower than the threshold voltage. For the sake of simplifying the description that will be given, each memory cell 44 is assumed to be an exemplary single-bit cell that stores a single bit. In FIGS. 3A and 3B, the vertical axis represents the number of the memory cells, and the horizontal axis represents a threshold voltage (corresponding to the charge amount of the floating gate). FIG. 3A indicates distributions of the thresholds of 1-bit cells. As illustrated in FIG. 3A, of the two threshold distributions, the left threshold distribution corresponds to data "1" and the right threshold distribution corresponds to data "0." Each memory cell 44 has a threshold voltage corresponding to either of the two threshold distributions in its initial state. When reading data from the nonvolatile memory 4, a default value $V_A$ of a data read voltage (hereinafter referred to as a "default read voltage $V_A$"), which is a boundary between the two threshold distributions, is applied to each memory cell 44. Thereby, whether the data stored in each memory cell 44 is "1" or "0" can be determined. In this way, in a case where each memory cell 44 has a storage capacity of N bits, each memory cell 44 has 2 to the power of N threshold voltage distributions.

A NAND flash memory has error factors, such as a data retention error, a read disturbance error and a program disturbance error. These error factors may cause a variation in the charge amount of the floating gate of each memory cell 44 and, therefore, the threshold distributions change as illustrated in FIG. 3B. For this reason, when data are read using a default read voltage $V_A$ initially set, the bit errors may occur.

The ECC circuit in the control unit 7 can deal with such read errors by subjecting the read data to the error correction processing. However, when the number of read errors exceeds the capacity of the error correction processing in the ECC circuit, the error correction processing in the ECC circuit fails. In order to prevent the failure of the error correction processing, it is necessary to read the data by using an appropriate data read voltage according to variations in the threshold distributions, thereby reducing the number of read errors. It is possible to acquire such an appropriate data read voltage by varying a read voltage for memory cells 44 in the minimum voltage steps that the memory system 1 can attain and by assessing accurately the plurality of threshold distributions of the memory cells 44. This method, however, results in the increase in the number (read count) of applications of the read voltage to each memory cell 44 in order to assess accurately the threshold distributions. Accordingly, it takes time to calculate a data read voltage, and heavier stress is placed on each memory cell 44. In the case of a NAND flash memory, as heavier stress is placed on each memory cell 44, a possibility of occurrence of error in data stored in the memory cells 44 increases.

Figure 4:
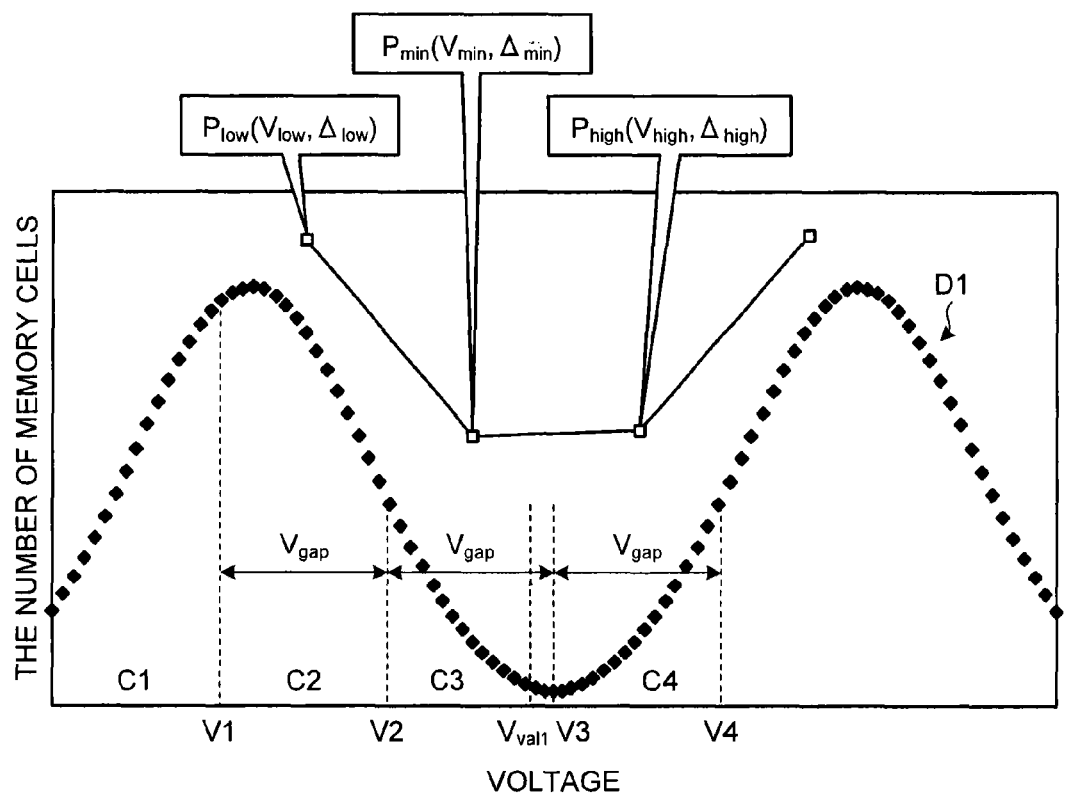
FIG. 4 is a view illustrating an exemplary result of statistical processing in an aggregating unit.

FIG. 4 is a view illustrating an exemplary result of statistical processing in the aggregating unit 8. In FIG. 4, the horizontal axis represents a voltage (a read voltage for the memory cells 44 illustrated in FIG. 1 or a threshold voltage for the memory cells 44), and the vertical axis represents the number of memory cells.

FIG. 4 illustrates a threshold distribution D1 obtained by varying a read voltage applied to the memory cells 44 in a memory cell group 43 in the minimum voltage steps that the memory system 1 can attain. The memory system 1 can perform tracking of the data read voltage after clarifying the threshold distribution D1. As described above, however, this method results in the increase in the read count. Accordingly, it takes time to calculate the data read voltage, and heavier stress may be placed on each memory cell 44. In view of this issue, the memory system 1 in the first embodiment can reduce the read count, and perform tracking of the data read voltage for the memory cells 44 without assessing the threshold distribution D1.

In order to achieve the above tracking, the aggregating unit 8 illustrated in FIG. 1 applies read voltages V1 to V4 to a memory cell group 43 in the nonvolatile memory 4. The read voltages V1 to V4 satisfy the relationship "V1<V2<V3<V4". Widths $V_{gap}$ of the individual read voltage ranges (between the read voltages V1 and V2, between the read voltages V2 and V3 and between the read voltages V3 and V4) are equal to one another. In FIG. 4, the value of each width $V_{gap}$ is set to an extent that the interval between the first and second peaks in the default threshold distribution (not illustrated) of the plurality of memory cells 44 is equally divided into four segments.

The aggregating unit 8 counts total quantities C1 to C4 of memory cells 44 through which current flows at the read voltages V1 to V4, respectively. The total quantity C1 is the total number of memory cells in the threshold distribution D1 which are plotted at the read voltage V1 or below. The total quantity C2 is the total number of memory cells present in the threshold distribution D1 at the read voltage V2 or below. The total quantity C3 is the total number of memory cells present in the threshold distribution D1 at the read voltage V3 or below. The total quantity C4 is the total number of memory cells present in the threshold distribution D1 at the read voltage V4 or below.

Subsequently, the aggregating unit 8 calculates the distributed number of memory cells 44 $\Delta_{low}$, $\Delta_{min}$ and $\Delta_{high}$, the threshold voltages of which fall within the respective read voltage ranges (between the read voltages V1 and V2, between the read voltages V2 and V3, and between the read voltages V3 and V4). Hereafter, "the distributed number of memory cells" is abbreviated as "distribution quantities". The aggregating unit 8 acquires the distribution quantities $\Delta_{low}$ by calculating (total quantity C2−total quantity C1). The aggregating unit 8 acquires the distribution quantities $\Delta_{min}$ by calculating (total quantity C3−total quantity C2). The aggregating unit 8 acquires the distribution quantities $\Delta_{high}$ by calculating (total quantity C4−total quantity C3). Specifically, the aggregating unit 8 individually counts the total quantities C1 to C4 such that the distribution quantities $\Delta_{low}$, $\Delta_{min}$ and $\Delta_{high}$ satisfy the relationships "$\Delta_{min} \leq \Delta_{low}$" and "$\Delta_{min} \leq \Delta_{high}$". Furthermore, the aggregating unit 8 determines the intermediate voltages $V_{low}$, $V_{min}$ and $V_{high}$ corresponding to the distribution quantities $\Delta_{low}$, $\Delta_{min}$ and $\Delta_{high}$, respectively. The intermediate voltage $V_{low}$ is set to the middle point of the read voltages V1 and V2 (i.e., (V2+V1)/2). The intermediate voltage $V_{min}$ is set to the middle point of the read voltages V3 and V2 (i.e., (V3+V2)/2). The intermediate voltage $V_{high}$ is set to the middle point of the read voltages V4 and V3 (i.e., (V4+V3)/2). In FIG. 4, these values are plotted as points $P_{low}(V_{low}, \Delta_{low})$, $P_{min}(V_{min}, \Delta_{min})$ and $P_{high}(V_{high}, \Delta_{high})$.

The aggregating unit 8 sends data regarding the widths $V_{gap}$ and the pints $P_{low}$, $P_{min}$ and $P_{high}$ to the calculating unit 9 illustrated in FIG. 1. When the calculating unit 9 receives these data, the calculating unit 9 calculates a read voltage $V_{va11}$ in accordance with the following equation (1).

$$V_{va11} = V_{min}(V_{gap}/2)\{(\Delta_{low} - \Delta_{high})/(\Delta_{low} - \Delta_{min}) + (\Delta_{high} - \Delta_{min})\} \quad (1)$$

The read voltage $V_{va11}$ calculated in this manner is sent from the calculating unit 9 to the control unit 7. In FIG. 4, the read voltage $V_{va11}$ is the point at which the interval between the read voltages V2 and V3 is divided internally at a ratio of ($f_{low} - \Delta_{min}$) ($\Delta_{high} - \Delta_{min}$). It can be assessed that the read voltage $v_{va11}$ corresponds to the valley portion of the threshold distribution of the memory cells 44 at the time when the data are read from the nonvolatile memory 4.

The calculating unit 9 subjects the read voltage $V_{va11}$ to predetermined calculation processing, such as a process of rounding off, then evaluates a read voltage $V_{va12}$ that is one of read voltages settable by the memory system 1 and is closest to the read voltage $V_{va11}$, and designates this read voltage $V_{va12}$ as the data read voltage. The memory system 1 designates the read voltage $V_{va12}$ as the data read voltage in this manner. As a result, it is possible to perform tracking of the data read voltage through a reduced read count for each memory cell 44. Hereinafter, the processing of evaluating the read voltage $V_{va11}$ or the read voltage $V_{va12}$ is referred to as tracking processing. According to the description with FIG. 4, the tracking processing is performed for each memory cell group 43 illustrated in FIG. 2; however it may be performed for each memory chip 41 illustrated in FIG. 1 or each block 42 illustrated in FIG. 2.

Figure 5:
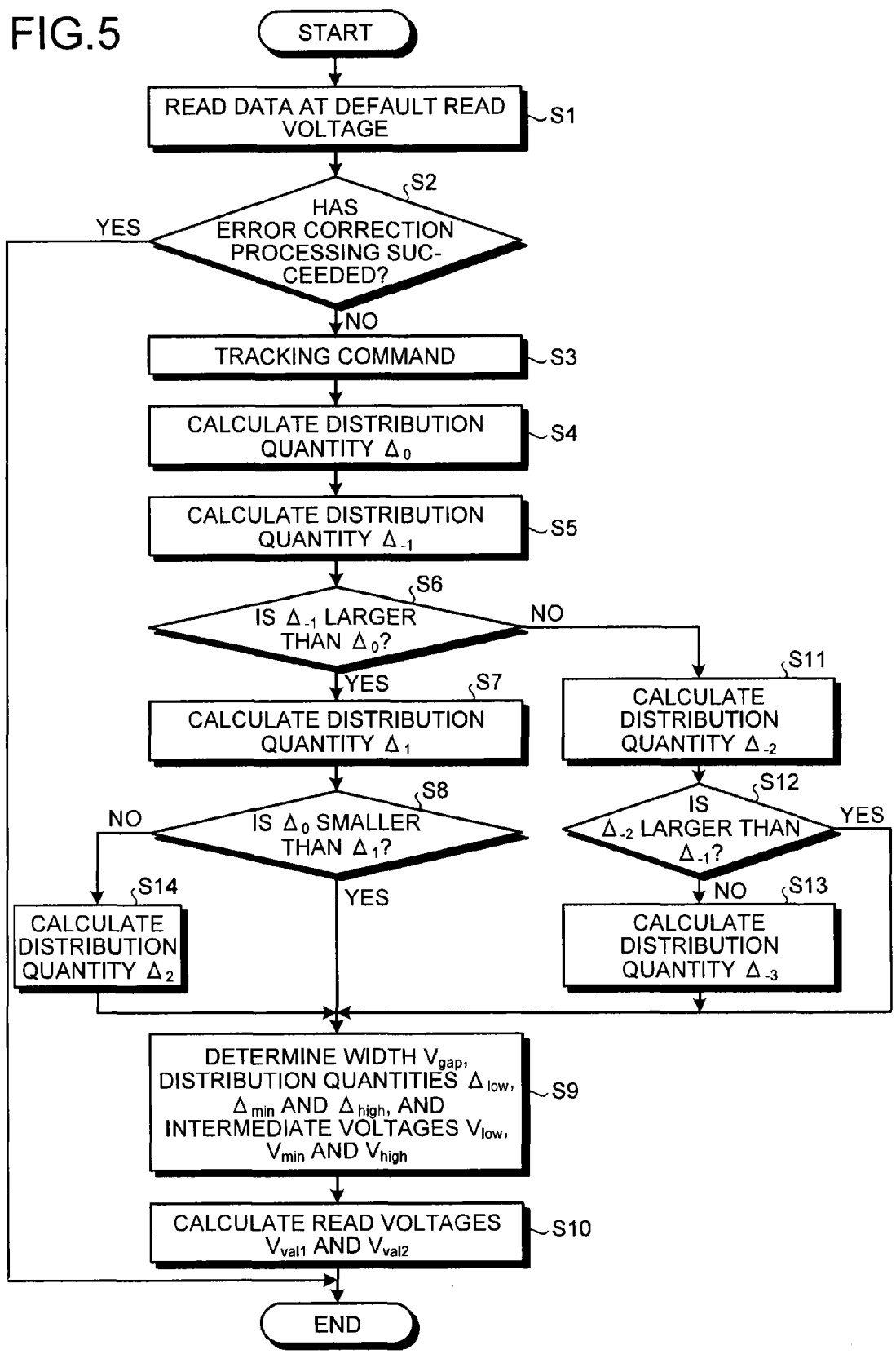
FIG. 5 is a flowchart of tracking processing in the memory system.

FIG. 5 is a flowchart of the tracking processing in the memory system 1. FIGS. 6A to 6D are views each illustrating a resultant pattern of the statistical processing in the aggregating unit 8. First, when the control unit 7 receives a read command from the host device 2 via the host I/F 10, the control unit 7 reads data from the nonvolatile memory 4 at a default read voltage in accordance with the read command (Step S1).

Next, the control unit 7 determines whether or not the ECC circuit has successfully performed the error correction processing for the read data (Step S2). If the control unit 7 determines that the error correction processing has succeeded (Step S2: YES), the control unit 7 sends the read data that have undergone the error correction processing to the host device 2 via the host I/F 10. If the control unit 7 determines that the error correction processing has failed (Step S2: NO), the control unit 7 sends a tracking command to the aggregating unit 8 (Step S3). When the aggregating unit 8 receives the tracking command, the aggregating unit 8 calculates the distribution quantity $\Delta_0$ of memory cells 44, the threshold voltages of which fall within the range between read voltages $v_0$ and $v_{-1}$ as illustrated in FIG. 6A (Step S4). An example of the read voltage $v_0$ is the default read voltage used at Step S1. The read voltage $v_{-1}$ satisfies the relationship "$v_{-1} < v_0$". The width of the range between the read voltages $v_0$ and $v_{-1}$ is equal to the width $V_{gap}$ described above. The distribution quantity $\Delta_0$ is calculated as a value obtained by subtracting the total quantity $c_{-1}$ of memory cells 44 with threshold voltages equal to or less than the read voltage $v_{-1}$ from the total quantity $c_0$ of memory cells 44 with threshold voltages less than the read voltage $v_0$. Next, the aggregating unit 8 calculates the distribution quantity $\Delta_{-1}$ of memory cells 44, the threshold voltages of which fall within the range between the read voltage $v_{-1}$ and a read voltage $v_{-2}$ as illustrated in FIG. 6A (Step S5). The read voltage $v_{-2}$ satisfies the relationship "$v_{-2} < v_{-1}$". The width of the range between the read voltages $v_{-1}$ and $v_{-2}$ is equal to the width $V_{gap}$ described above. The distribution quantity $\Delta_{-1}$ is calculated as a value obtained by subtracting the total quantity $c_{-2}$ of memory cells 44 with threshold voltages equal to or less than the read voltage $v_{-2}$ from the total quantity $c_{-1}$.

Next, the aggregating unit 8 compares magnitudes between the distribution quantities $\Delta_0$ and $\Delta_{-1}$ (Step S6). If the aggregating unit 8 determines that $\Delta_{-1}$ is larger than $\Delta_0$ as illustrated in FIG. 6A (Step S6: YES), the aggregating unit 8 calculates the distribution quantity $\Delta_1$ of memory cells 44, the threshold voltages of which fall within the range between the read voltage $v_0$ and a read voltage $v_1$ as illustrated in FIG. 6A (Step S7). The read voltage $v_1$ satisfies the relationship "$v_0 < v_1$". The width of the range between the read voltages $v_0$ and $v_1$ is equal to the width $V_{gap}$ described above. The distribution quantity $\Delta_1$ is calculated as a value obtained by subtracting the total quantity $c_0$ from the total quantity $c_1$ of memory cells 44 with threshold voltages equal to or less than the read voltage $v_1$.

Next, the aggregating unit 8 compares magnitudes between the distribution quantities $\Delta_0$ and $\Delta_1$ (Step S8). If the aggregating unit 8 determines that $\Delta_{gap}$ is smaller than $\Delta_1$ as illustrated in FIG. 6A (Step S8: YES), the aggregating unit 8 determines the width $V_{gap}$, distribution quantities $\Delta_{low}$, $\Delta_{min}$ and $\Delta_{high}$, and intermediate voltages $V_{low}$, $V_{min}$ and $V_{high}$ and sends them to the calculating unit 9 (Step S9). In this case, the distribution quantity $\Delta_{low}$ is the distribution quantity $\Delta_{-1}$. The distribution quantity $\Delta_{min}$ is the distribution quantity $\Delta_0$. The distribution quantity $\Delta_{high}$ is the distribution quantity $\Delta_1$. The intermediate voltage $V_{low}$ is the middle point between the read voltages $v_{-1}$ and $v_{-2}$ (($v_{-1}+v_{-2}$)/2). The intermediate voltage $V_{min}$ is the middle point between the read voltages $v_0$ and $v_{-1}$ (($v_0+v_{-1}$)/2). The intermediate voltage $V_{high}$ is the middle point between the read voltages $v_0$ and $v_1$ (($v_1+v_0$)/2).

The calculating unit 9 calculates a read voltage $V_{va11}$ in accordance with the equation (1), and sends the resultant to the control unit 7. Then, the control unit 7 evaluates the read voltage $V_{va12}$ on the basis of the read voltage $V_{va11}$ (step S10). The read voltage $V_{va11}$ evaluated in this manner is the point at which the interval between the read voltages $v_0$ and $v_{-1}$ is divided internally at the ratio of ($\Delta_{-1}-\Delta_0$):($\Delta_1-\Delta_0$) as illustrated in FIG. 6A.

If the aggregating unit 8 determines that the relationship "$\Delta_{-1}>\Delta_0$" is not satisfied, namely, the relationship "$\Delta_{-1}\leq\Delta_0$" is satisfied as illustrated in FIG. 6B, at Step S6 (Step S6: NO), the aggregating unit 8 calculates the distribution quantity $\Delta_{-2}$ of memory cells 44, the threshold voltages of which fall within the range between the read voltage $v_{-2}$ and a read voltage $v_{-3}$ as illustrated in FIG. 6B (Step S11). The read voltage $V_{-3}$ satisfies the relationship "$v_{-3}<v_{-2}$". The width of the range between the read voltages $v_{-2}$ and $v_{-3}$ is equal to the width $V_{gap}$ described above. The distribution quantity $\Delta_{-2}$ is calculated as a value obtained by subtracting the total quantity $c_{-3}$ of memory cells 44 with threshold voltages equal to or less than the read voltage $v_{-3}$ from the total quantity $c_{-2}$, as illustrated in FIG. 6B.

Subsequently, the aggregating unit 8 compares magnitudes between the distribution quantities $\Delta_{-1}$ and $\Delta_{-2}$ (Step S12). If the aggregating unit 8 determines that $\Delta_{-2}$ is larger than $\Delta_{-1}$ as illustrated in FIG. 6B (Step S12: YES), the aggregating unit 8 determines the width $V_{gap}$, distribution quantities A $\Delta_{low}$, $\Delta_{min}$ and $\Delta_{high}$, and intermediate voltages $V_{low}$, $V_{min}$ and $V_{high}$, and then sends them to the calculating unit 9 (Step S9). In this case, the distribution quantity $\Delta_{low}$ is the distribution quantity $\Delta_{-2}$. The distribution quantity $\Delta_{min}$ is the distribution quantity $\Delta_{-1}$. The distribution quantity $\Delta_{high}$ is the distribution quantity $\Delta_0$. The intermediate voltage $V_{low}$ is the middle point between the read voltages $v_{-2}$ and $v_{-3}$ (($v_{-2}$'$v_{-3}$)/2). The intermediate voltage $V_{min}$ is the middle point between the read voltages $v_{-1}$ and $v_{-2}+v_{-2}$)/2). The intermediate voltage $V_{high}$ is the middle point between the read voltages $v_0$ and $v_{-1}$ (($v_0+v_{-1}$)/2).

The calculating unit 9 calculates a read voltage $V_{va11}$ in accordance with the equation (1), and sends the resultant to the control unit 7. Then, the control unit 7 evaluates a read voltage $V_{va12}$ on the basis of the read voltage $V_{va11}$ (step S10). The read voltage $V_{va11}$ evaluated in this manner is the point at which the interval between the read voltages $v_{-1}$ and $V_{-2}$ is divided internally at the ratio of ($\Delta_{-2}-\Delta_{-1}$):($\Delta_0-\Delta_{-1}$) as illustrated in FIG. 6B.

On the other hand, if the aggregating unit 8 determines that $\Delta_{-2}$ is equal to or smaller than $\Delta_{-1}$ as illustrated in FIG. 6C (Step S12: NO), the aggregating unit 8 calculates the distribution quantity $\Delta_{-3}$ of memory cells 44, the threshold voltage of which falls within a range between the read voltage $v_{-3}$ and a read voltage $v_{-4}$ as illustrated in FIG. 6C (Step S13). The read voltage $v_{-4}$ satisfies the relationship "$v_{-4}<v_{-3}$". The width of the range between the read voltages $v_{-3}$ and $v_{-4}$ is equal to the width $V_{gap}$ described above. The distribution quantity $\Delta_{-3}$ is calculated as a value obtained by subtracting the total quantity $c_{-4}$ of memory cells 44 with threshold voltages equal to or less than the read voltage $v_{-4}$ from the total quantity $c_{-3}$, as illustrated in FIG. 6C. Subsequently, the aggregating unit 8 determines the width $V_{gap}$, distribution quantities $\Delta_{low}$, $\Delta_{min}$ and $\Delta_{high}$, and intermediate voltages $V_{low}$, $V_{min}$ and $V_{high}$, and then sends them to the calculating unit 9 (Step S9). In this case, the distribution quantity $\Delta_{low}$ is the distribution quantity $\Delta_{-3}$. The distribution quantity is the distribution quantity $\Delta_{-2}$. The distribution quantity $\Delta_{high}$ is the distribution quantity $\Delta_{-1}$. The intermediate voltage $V_{low}$ is the middle point between the read voltages $v_{-3}$ and $v_{-3}$ (($v_{-3}+v_{-4}$)/2). The intermediate voltage $V_{min}$ is the middle point between the read voltages $v_{-2}$ and $v_{-3}$ (($v_{-2}+v_{-3}$)/2). The intermediate voltage $V_{high}$ is the middle point between the read voltages $v_{-1}$ and $v_{-2}$ (($v_{-1}+v_{-2}$)/2). Each of the widths of the respective read voltage ranges (between the read voltages $v_0$ and $v_{-1}$, between the read voltages $v_{-1}$ and $v_{-2}$, between the read voltages $v_{-3}$ and between the read voltages $v_{-2}$ and $v_{-3}$) is set to be equal to the width $V_{gap}$. Therefore, the relationship "$\Delta_{-3}\geq\Delta_{-2}$" is satisfied. It is thus possible to determine the distribution quantities $\Delta_{low}$, $\Delta_{min}$ and $\Delta_{high}$ and the intermediate voltages $v_{low}$, $V_{min}$ and $V_{high}$ without the need to perform tracking of the memory cells 44 each having a threshold voltages less than the read voltage $v_{-4}$.

Subsequently, the calculating unit 9 calculates a read voltage $V_{va11}$ in accordance with the equation (1), and sends the resultant to the control unit 7. Then, the control unit 7 evaluates a read voltage $V_{va12}$ on the basis of the read voltage $V_{va11}$ (step S10). The read voltage $V_{va11}$ evaluated in this manner is the point at which the interval between the read voltages $v_{-2}$ and $v_{-3}$ is divided internally at the ratio of ($\Delta_{-3}-\Delta_{-2}$):($\Delta_{-1}-\Delta_{-2}$) as illustrated in FIG. 6C.

If the aggregating unit 8 determines that the relationship "$\Delta_0<\Delta_1$" is not satisfied, namely, the relationship "$\Delta_0\geq\Delta_1$" is satisfied as illustrated in FIG. 6D, at Step S8 (Step S8: NO), the aggregating unit 8 calculates the distribution quantity $\Delta_2$ of memory cells 44, the threshold voltages of which fall within the range between the read voltage $v_1$ and a read voltage $v_2$ as illustrated in FIG. 6D (Step S14). The read voltage $V_2$ satisfies the relationship "$v_1<v_2$". The width between the read voltages $v_1$ and $v_2$ is equal to the width $V_{gap}$ described above. The distribution quantity $\Delta_2$ is calculated as a value obtained by subtracting the total quantity $c_1$ from the total quantity $c_2$ of memory cells 44 with threshold voltages equal to or less than the read voltage $v_2$, as illustrated in FIG. 6D. Subsequently, the aggregating unit 8 determines the width $V_{gap}$, distribution quantities $\Delta_{low}$, $\Delta_{min}$ and $\Delta_{high}$, and intermediate voltages $V_{low}$, $V_{min}$ and $V_{high}$, and then sends them to the calculating unit 9 (Step S9). In this case, the distribution quantity $\Delta_{low}$ is the distribution quantity $\Delta_0$. The distribution quantity $\Delta_{min}$ is the distribution quantity $\Delta_1$. The distribution quantity $\Delta_{high}$ is the distribution quantity $\Delta_2$. The intermediate voltage $V_{low}$ is the middle point between the read voltages $v_0$ and $v_{-1}$ (($v_0+v_{-1}$/2). The intermediate voltage $V_{min}$ is the middle point between the read voltages $v_0$ and $v_1$ (($v_1+v_0$)/2). The intermediate voltage $V_{high}$ is the middle point between the read voltages $v_1$ and $v_2$ (($v_2+v_1$)/2). Each of the widths of the respective read voltage ranges (between the read voltages $v_{-1}$ and $v_{-2}$, between the read voltages $v_0$ and $v_{-1}$, between the read voltages $v_0$ and $v_1$, and between the read voltages $v_1$ and $v_2$) is equal to the width $V_{gap}$. Therefore, the relationship "$\Delta_1 \leq \Delta_2$" is satisfied. It is thus possible to determine the distribution quantities $\Delta_{low}$, $\Delta_{min}$ and $\Delta_{high}$ and the intermediate voltages $V_{low}$, $V_{min}$ and $V_{high}$ without the need to perform tracking of the memory cells 44 with threshold voltages exceeding the read voltage $v_2$.

Subsequently, the calculating unit 9 calculates a read voltage $V_{va11}$ in accordance with the equation (1), and sends the resultant to the control unit 7. Then, the control unit 7 evaluates a read voltage $V_{va12}$ on the basis of the read voltage $V_{va11}$ (step S10). The read voltage $V_{va11}$ evaluated in this manner is the point at which the interval between the read voltages $v_0$ and $v_1$ is divided internally at the ratio of $(\Delta_0-\Delta_1):(\Delta_2-\Delta_1)$ as illustrated in FIG. 6D.

The read voltage $V_{va12}$ evaluated through Steps S1 to S14 described above is assessed as the modification of the default read voltage that has been selected for the read voltage $v_0$ at Step S4. Therefore, the control unit 7 illustrated in FIG. 1 designates the read voltage $V_{va12}$ as the data read voltage for use in reading data from the memory cells 44, from which the data would be typically read at the default read voltage.

According to the first embodiment, a aggregating unit 8 in a memory system 1 compares magnitudes among distribution quantities $\Delta_{-3}$ to $\Delta_2$ that have been calculated from read voltage ranges (between the read voltages $v_{-4}$ and $v_{-3}$, between the read voltages $v_{-3}$ and $v_{-2}$, between the read voltages $v_{-2}$ and $v_{-1}$, between the read voltages $v_{-1}$ and $v_0$, between the read voltages $v_0$ and $v_1$, and between the read voltages $v_1$ and $v_2$) having a width $V_{gap}$, and then determines distribution quantities $\Delta_{min}$, $\Delta_{low}$ and $\Delta_{high}$. A calculating unit 9 in the memory system 1 then calculates a read voltage $V_{va11}$ in accordance with the equation (1), and further calculates a read voltage $V_{va12}$ on the basis of the read voltage $V_{va11}$. Then, a control unit 7 designates the read voltage $V_{va12}$ as a data read voltage. Consequently, at the time of reading data from the memory cells 44, the memory system 1 can perform tracking of a data read voltage through a decreased read count for the memory cells 44 (e.g., through four applications using four read voltages $v_1$, $v_0$, $v_{-1}$ and $v_{-2}$ at the minimum). Thus, the memory system 1 can perform the tracking at a higher speed. Moreover, a decreased read count, as described above, enables the memory system 1 to reduce stress placed on the memory cells 44, decreasing the probability with which data errors occur in the nonvolatile memory 4.

Second Embodiment

A feature of a memory system 1 in a second embodiment is high-speed determination of a data read voltage for memory cells 44 that can store two or more bits of data (multiple values). Hereinafter, components that are the same as those in the first embodiment are denoted by the same reference characters, and will not be repeatedly described.

Figure 7:
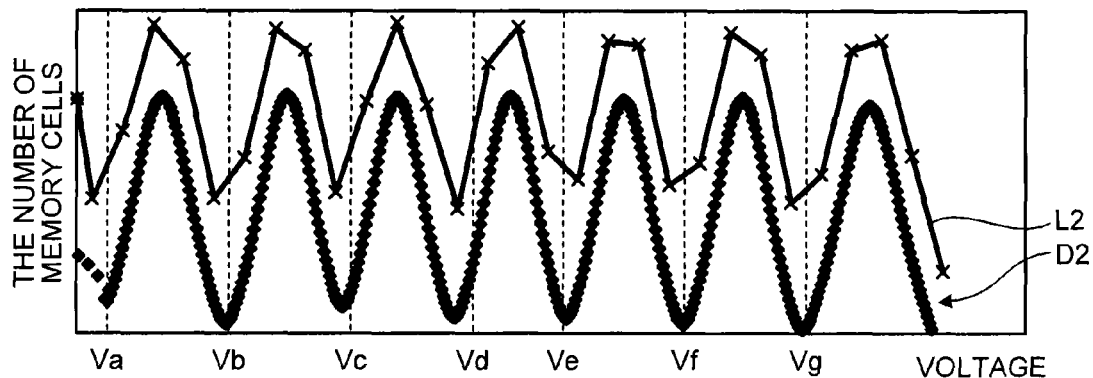
FIG. 7 is a view illustrating an exemplary result of statistical processing that the aggregating unit applies to memory cells, each of which stores multiple values.

FIG. 7 is a view illustrating an exemplary result of statistical processing that a aggregating unit 8 applies to the memory cells 44, each of which stores multiple values. When each memory cell 44 stores multiple values, four or more threshold distributions are generated. FIG. 7 exemplifies the plurality of memory cells 44, each of which stores 3-bit data (8 values), and illustrates threshold distributions D2 at the time of reading data from the memory cells 44. As illustrated in the drawing, the memory cells 44, each of which stores an 8-bit value, exhibit eight threshold distributions. Each threshold distribution corresponds to 3-bit data. FIG. 7 illustrates default read voltages Va to Vg at which each data is read.

The aggregating unit 8 performs the statistical processing (Steps S3 to S9 and S11 to S13 in FIG. 5) by replacing the read voltage $v_1$ described in the first embodiment with the default read voltages Va to Vg. Then, the points $P_{low}$ ($V_{low}$, $\Delta_{low}$), $P_{min}$($V_{min}$, $\Delta_{min}$) and $P_{high}$($V_{high}$, $\Delta_{high}$) described in the first embodiment are located for each of the default read voltages Va to Vg, and the plotted points are connected to form a line L2 in FIG. 7.

From the individual points of the upper-side line L2 and on the basis of the equation (1), it is possible to calculate read voltages $V_{va11}$ and $V_{va12}$ corresponding to the individual default read voltages Va to Vg and to perform tracking of the data read voltages. In this case, the aggregating unit 8 in FIG. 1 needs to perform the tracking processing described in the first embodiment (Steps S3 to S14 in FIG. 5) using each of the default read voltages Va to Vg, and determine the data read voltages. However, the statistical processing in the aggregating unit 8 involves high throughput, and the much time is required to perform tracking of the data read voltages. For this reason, the memory system 1 in the second embodiment can perform the tracking processing on the basis of any one of the plurality of default read voltages Va to Vg, and determine data read voltages corresponding to the default read voltages Va to Vg.

Figure 8:
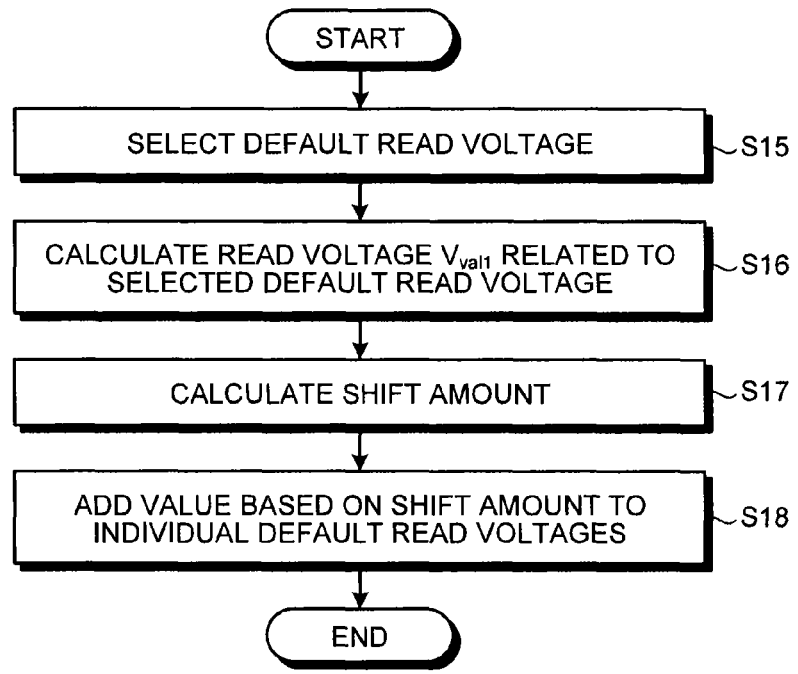
FIG. 8 is a flowchart of a method of determining data read voltages in a memory system according to a second embodiment.

FIG. 8 is a flowchart of a method of determining the data read voltages in the memory system 1 according to the second embodiment. A description will be given using the threshold distributions illustrated in FIG. 7 as an example. When the aggregating unit 8 receives a tracking command from a control unit 7, the aggregating unit 8 selects an arbitrary one, for example, the default read voltage Vf, from among the plurality of default read voltages Va to Vg (Step S15). Next, the aggregating unit 8 and a calculating unit 9 set a read voltage $v_1$, as described in the first embodiment, to the selected default read voltage Vf. Then, the aggregating unit 8 and the calculating unit 9 perform tracking processing that is the same as the processing in the first embodiment (Steps S3 to S14 in FIG. 5), and calculates a read voltage $V_{va11}$ (Step S16). In this exemplary case, the read voltage $V_{va11}$ corresponds to the default read voltage Vf because it is calculated on the basis of the default read voltage Vf. In other words, the read voltage $V_{va11}$ is the data read voltage for use in reading data, which would be typically read from the memory cells 44 at the default read voltage Vf.

Next, the calculating unit 9 calculates an amount ($V_{va11}$−Vf) by which the read voltage $V_{va11}$ is shifted from the default read voltage Vf (Step S17). Then, the calculating unit 9 adds a value determined from the shift amount to the default read voltages Va to Vg (Step S18), and sends the addition results to the control unit 7. The control unit 7 designates these addition results as data read voltages for use in reading data in the memory cells 44, which would be typically read at the default read voltages Va to Vg.

According to the second embodiment, the aggregating unit 8 and the calculating unit 9 in the memory system 1 select an arbitrary one from among a plurality of default read voltages Va to Vf, and then perform tracking processing as described in the first embodiment. Subsequently, the aggregating unit 8 and the calculating unit 9 calculate a shift amount (e.g., $V_{va11}$−Vf) from an calculated read voltage $V_{va11}$, and then determines data read voltages corresponding to the default read voltages Va to Vg. Consequently, the memory system 1 can determine the data read voltages corresponding to the default read voltages Va to Vg without the need to perform tracking processing, as in the first embodiment, for each of the default read voltages Va to Vg. Thereby, high-speed tracking of individual data read voltages can be achieved.

Third Embodiment

A feature of a memory system 1 in a third embodiment is to track a data read voltage from one of a plurality of memory cell groups 43, as described in FIG. 2, in a nonvolatile memory 4 and to designate it as a data read voltage for the other memory cell groups 43. Hereinafter, components that are the same as those in the first embodiment are denoted by the same reference characters, and will not be repeatedly described.

FIG. 9 is a flowchart of a method of determining a data read voltage in the memory system 1 according to the third embodiment. First, when a aggregating unit 8 receives a tracking command from a control unit 7, the aggregating unit 8 selects one of the plurality of memory cell groups 43 in the nonvolatile memory 4 as a target for tracking processing as described in the first embodiment (Step S19). Next, the control unit 7, the aggregating unit 8 and a calculating unit 9 subject the selected memory cell group 43 to the tracking processing (Steps S4 to S14 in FIG. 5), and then calculates a read voltage $V_{va12}$ (Step S20). The control unit 7 designates the read voltage $V_{va12}$ evaluated in this manner as a-data read voltage for the memory cells 44 in the other memory cell groups 43 in the nonvolatile memory 4, and then reads data from each memory cell 44 at the read voltage $V_{va12}$ (Step S21).

Subsequently, the control unit 7 determines whether or not the ECC circuit has successfully performed the error correction processing for the read data (Step S22). If the control unit 7 determines that the error correction processing has succeeded at Step S22 (Step S22: YES), the control unit 7 sends the read data to a host device 2. On the other hand, if the control unit 7 determines that the error correction processing in the ECC circuit has failed (Step S22: NO), the control unit 7 sends a re-tracking command to the aggregating unit 8 in order to subject each memory cell group 43 to statistical processing (Steps S4 to S9 and S10 to 14 in FIG. 5) that is the same as the processing in the first embodiment (Step S23).

When the aggregating unit 8 receives the re-tracking command, the aggregating unit 8 performs the statistical processing for each memory cell group 43 in accordance with the command. The calculating unit 9 calculates a read voltage $V_{va11}$ for each memory cell group 43 on the basis of the result of the statistical processing in the aggregating unit 8, as in the first embodiment. Then, the calculating unit 9 sends the evaluation result to the control unit 7 (Step S10 in FIG. 5). The control unit 7 evaluates $V_{va12}$ on the basis of the read voltage $V_{va11}$ evaluated in this manner (Step S10 in FIG. 5), and then designates the read voltage $V_{va12}$ as the data read voltage corresponding to the individual memory cell groups 43.

According to the third embodiment, a memory system 1 subjects one of a plurality of memory cell groups 43 in a nonvolatile memory 4 to tracking processing in the same manner as in the first embodiment. Then, the memory system 1 designates an evaluated read voltage $V_{va12}$ as a data read voltage for the memory cells 44 in the other memory cell groups 43. Consequently, it is possible for the memory system 1 to perform tracking of the data read voltage without the need to subject the other memory cell groups 43 to tracking processing, thus achieving high-speed tracking.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
   a nonvolatile memory that includes a plurality of memory cells, each of the memory cells having a storage capacity of N bits in accordance with 2 to the power of N threshold voltage distributions, where N is a natural number that is equal to or greater than 1; and
   a controller configured to
      read data from the plurality of memory cells by using four voltage values,
      associate three voltage ranges designated by the four voltage values with a number of the memory cells using the four voltage values,
      specify, from the three voltage ranges, a first voltage range, a second voltage range, and a third voltage range, the first voltage range having a first distributed number of memory cells, the first distributed number of memory cells being a minimum value of the memory cells, the second voltage range being adjacent to a lower voltage side of the first voltage range, the third voltage range being adjacent to a higher voltage side of the first voltage range,
      determine a read voltage by using the first voltage range, a first representative voltage value in the first voltage range, the first distributed number of memory cells, a second distributed number of memory cells, and a third distributed number of memory cells, the second distributed number of memory cells being a number of memory cells corresponding to the second voltage range, the third distributed number of memory cells being a number of memory cells corresponding to the third voltage range, and
      read the data from the nonvolatile memory by using the determined read voltage.

2. The memory system according to claim 1, wherein the controller determines the read voltage based on a voltage at which the first voltage range is divided internally at a ratio of a first value to a second value, the first value indicating a difference between the second and first distributed number of memory cells, the second value indicating a difference between the third and first distributed number of memory cells.

3. The memory system according to claim 1, wherein the controller specify the first to third voltage ranges from four voltage ranges, the four voltage ranges being acquired by equally dividing into four between a first peak and a second peak adjacent to the first peak in the plurality of threshold voltage distributions.

4. The memory system according to claim 2, wherein the controller reads data from the nonvolatile memory based on an address specified by a read command received from a host device, and determines the read voltage when it is determined that error correction processing for the read data has failed.

5. The memory system according to claim 4, wherein the first representative voltage value is a median value of two voltage values among the four voltage values, the two voltage values designating the first voltage range.

6. The memory system according to claim 4, wherein
   the controller is configured to
      calculate a first difference, the first difference being a difference between a first total number of memory cells and a second total number of memory cells, the first total number of memory cells being a total number of memory cells having a threshold voltage equal to or lower than a first read voltage, the second total number of memory cells being a total number of memory cells having a threshold voltage equal to or lower than a second read voltage, the second read voltage being lower than the first read voltage, calculate a second difference, the second difference being a difference between the second total number of memory cells and a third total number of memory cells, the third total number of memory cells being a total number of memory cells having a threshold voltage equal to or lower than a third read voltage, the third read voltage being lower than the second read voltage, in a case where the first difference is smaller than the second difference, calculate a third difference, the third difference being a difference between the first total number of memory cells and a forth total number of memory cells, the forth total number of memory cells being a total number of memory cells having a threshold voltage equal to or lower than a forth read voltage, the fourth read voltage being higher than the first read voltage, in a case where the first difference is smaller than the third difference, specify a voltage range designated by the first and second read voltages as the first voltage range, and set the first difference as the first distributed number of memory cells, set the second difference as the second distributed number of memory cells, set the third difference as the third distributed number of memory cells, and determine the read voltage by using the first, second, and third distributed number of memory cells.

7. The memory system according to claim 6, wherein the controller is configured to in a case where the first difference is greater than the second difference, calculate a fourth difference, the forth difference being a difference between the third total number of memory cells and a fifth total number of memory cells, the fifth total number of memory cells being a total number of memory cells having a threshold voltage equal to or lower than a fifth read voltage, the fifth read voltage being lower than the third read voltage, in a case where the second difference is smaller than the fourth difference, specify a voltage range designated by the second and third read voltages as the first voltage range, and set the second difference as the first distributed number of memory cells, set the fourth difference as the second distributed number of memory cells, set the first difference as the third distributed number of memory cells, and determine the read voltage by using the first, second, and third distributed number of memory cells.

8. The memory system according to claim 7, wherein the controller is configured to in a case where the second difference is greater than the fourth difference, calculate a fifth difference, the fifth difference being a difference between the fifth total number of memory cells and a sixth total number of memory cells, the sixth total number of memory cells being a total number of memory cells having a threshold voltage equal to or lower than a sixth read voltage, the sixth read voltage being lower than the fifth read voltage, specify a voltage range designated by the third and fifth read voltages as the first voltage range, and set the fourth difference as the first distributed number of memory cells, set the fifth difference as the second distributed number of memory cells, set the second difference as the third distributed number of memory cells, and determine the read voltage by using the first, second, and third distributed number of memory cells.

9. The memory system according to claim 8, wherein the controller is configured to in a case where the first difference is greater than the third difference, calculate a sixth difference, the sixth difference being a difference between the fourth total number of memory cells and a seventh total number of memory cells, the seventh total number of memory cells being a total number of memory cells having a threshold voltage equal to or lower than a seventh read voltage, the seventh read voltage being lower than the fourth read voltage, specify a voltage range designated by the first and fourth read voltages as the first voltage range, and set the third difference as the first distributed number of memory cells, set the first difference as the second distributed number of memory cells, set the sixth difference as the third distributed number of memory cells, and determine the read voltage by using the first, second, and third distributed number of memory cells.

10. The memory system according to claim 9, wherein the first read voltage is a first default read voltage for the nonvolatile memory.

11. The memory system according to claim 10, wherein N is a natural number that is equal to or greater than 2, and the controller determines a read voltage corresponding to a second default read voltage for the nonvolatile memory based on a shift amount of the read voltage from the first default read voltage.

12. The memory system according to claim 10, wherein the nonvolatile memory includes a plurality of memory cell groups as read units, and the controller determines a read voltage for a first memory cell group, and uses the read voltage for the first memory cell group as a read voltage for a second memory cell group.

13. A method of controlling a nonvolatile memory including a plurality of memory cells, each of the memory cells having a storage capacity of N bits in accordance with 2 to the power of N threshold voltage distributions, where N is a natural number that is equal to or greater than 1, the method comprising:

reading data from the plurality of memory cells by using four voltage values;

associating three voltage ranges designated by the four voltage values with a number of the memory cells using the four voltage values;

specifying, from the three voltage ranges, a first voltage range, a second voltage range, and a third voltage range, the first voltage range having a first distributed number of memory cells, the first distributed number of memory cells being a minimum value of the memory cells, the second voltage range being adjacent to a lower voltage side of the first voltage range, the third voltage range being adjacent to a higher voltage side of the first voltage range;

determining a read voltage by using the first voltage range, a first representative voltage value in the first voltage range, the first distributed number of memory cells, a second distributed number of memory cells, and a third distributed number of memory cells, the second distributed number of memory cells being a number of memory cells corresponding to the second voltage range, the third distributed number of memory cells being a number of memory cells corresponding to the third voltage range; and reading the data from the nonvolatile memory by using the determined read voltage.

14. The method according to claim 13, further comprising determining the read voltage based on a voltage at which the first voltage range is divided internally at a ratio of a first value to a second value, the first value indicating a difference between the second and first distributed number of memory cells, the second value indicating a difference between the third and first distributed number of memory cells.

15. The method according to claim 13, further comprising specifying the first to third voltage ranges from four voltage ranges, the four voltage ranges being acquired by equally dividing into four between a first peak and a second peak adjacent to the first peak in the plurality of threshold voltage distributions.

16. The method according to claim 14, further comprising reading data from the nonvolatile memory based on an address specified by a read command received from a host device, and determining the read voltage when it is determined that error correction processing for the read data has failed.

17. The method according to claim 16, further comprising:

calculating a first difference, the first difference being a difference between a first total number of memory cells and a second total number of memory cells, the first total number of memory cells being a total number of memory cells having a threshold voltage equal to or lower than a first read voltage, the second total number of memory cells being a total number of memory cells having a threshold voltage equal to or lower than a second read voltage, the second read voltage being lower than the first read voltage;

calculating a second difference, the second difference being a difference between the second total number of memory cells and a third total number of memory cells, the third total number of memory cells being a total number of memory cells having a threshold voltage equal to or lower than a third read voltage, the third read voltage being lower than the second read voltage;

in a case where the first difference is smaller than the second difference, calculating a third difference, the third difference being a difference between the first total number of memory cells and a forth total number of memory cells, the forth total number of memory cells being a total number of memory cells having a threshold voltage equal to or lower than a forth read voltage, the fourth read voltage being higher than the first read voltage;

in a case where the first difference is smaller than the third difference, specifying a voltage range designated by the first and second read voltages as the first voltage range; and setting the first difference as the first distributed number of memory cells, setting the second difference as the second distributed number of memory cells, setting the third difference as the third distributed number of memory cells, and determining the read voltage by using the first, second, and third distributed number of memory cells.

18. The method according to claim 17, further comprising:

in a case where the first difference is greater than the second difference, calculating a fourth difference, the forth difference being a difference between the third total number of memory cells and a fifth total number of memory cells, the fifth total number of memory cells being a total number of memory cells having a threshold voltage equal to or lower than a fifth read voltage, the fifth read voltage being lower than the third read voltage;

in a case where the second difference is smaller than the fourth difference, specifying a voltage range designated by the second and third read voltages as the first voltage range; and setting the second difference as the first distributed number of memory cells, setting the fourth difference as the second distributed number of memory cells, setting the first difference as the third distributed number of memory cells, and determining the read voltage by using the first, second and third distributed number of memory cells.

19. The method according to claim 18, further comprising:

in a case where the second difference is greater than the fourth difference, calculating a fifth difference, the fifth difference being a difference between the fifth total number of memory cells and a sixth total number of memory cells, the sixth total number of memory cells being a total number of memory cells having a threshold voltage equal to or lower than a sixth read voltage, the sixth read voltage being lower than the fifth read voltage;

specifying a voltage range designated by the third and fifth read voltages as the first voltage range; and setting the fourth difference as the first distributed number of memory cells, setting the fifth difference as the second distributed number of memory cells, setting the second difference as the third distributed number of memory cells, and determining the read voltage by using the first, second, and third distributed number of memory cells.

20. The method according to claim 18, further comprising:

in a case where the first difference is greater than the third difference, calculating a sixth difference, the sixth difference being a difference between the fourth total number of memory cells and a seventh total number of memory cells, the seventh total number of memory cells being a total number of memory cells having a threshold voltage equal to or lower than a seventh read voltage, the seventh read voltage being lower than the fourth read voltage;

specifying voltage range designated by the first and fourth read voltages as the first voltage range; and setting the third difference as the first distributed number of memory cells, setting the first difference as the second distributed number of memory cells, setting the sixth difference as the third distributed number of memory cells, and determining the read voltage by using the first, second, and third distributed number of memory cells.

* * * * *